(12) United States Patent
Lu et al.

(10) Patent No.: US 9,721,913 B2
(45) Date of Patent: Aug. 1, 2017

(54) SEMICONDUCTOR PACKAGE AND METHOD OF MANUFACTURING THEREOF

(71) Applicant: CHIPMOS TECHNOLOGIES INC., Hsinchu (TW)

(72) Inventors: Tung Bao Lu, Hsinchu (TW); Heng-Sheng Wang, Hsinchu (TW); Tzu-Han Hsu, Hsinchu (TW)

(73) Assignee: CHIPMOS TECHNOLOGIES INC, Hsinchu (TW)

( * ) Notice: Subject to any disclaimer, the term of this patent is extended or adjusted under 35 U.S.C. 154(b) by 0 days.

(21) Appl. No.: 15/240,291

(22) Filed: Aug. 18, 2016

(65) Prior Publication Data
US 2016/0358872 A1    Dec. 8, 2016

Related U.S. Application Data

(62) Division of application No. 14/689,491, filed on Apr. 17, 2015, now abandoned.

(51) Int. Cl.
*H01L 21/44* (2006.01)
*H01L 21/4763* (2006.01)
(Continued)

(52) U.S. Cl.
CPC ............... *H01L 24/11* (2013.01); *C25D 3/60* (2013.01); *C25D 3/62* (2013.01); *C25D 5/505* (2013.01);
(Continued)

(58) Field of Classification Search
CPC ....... H01L 33/62; H01L 33/486; H01L 33/32; H01L 33/38; H01L 2224/48091;
(Continued)

(56) References Cited

U.S. PATENT DOCUMENTS 4,875,617 A * 10/1989 Citowsky ............. B23K 35/007
228/123.1
5,838,069 A * 11/1998 Itai ...................... H01L 21/4853
257/703
(Continued)

FOREIGN PATENT DOCUMENTS

JP          61015992 A  *  1/1986
JP         2001192886 A  *  7/2001

*Primary Examiner* — Teresa M Arroyo
(74) *Attorney, Agent, or Firm* — WPAT, P.C., Intellectual Property Attorneys; Anthony King

(57) ABSTRACT

A semiconductor package comprises a semiconductor chip having an active surface with a conductive pad thereon; an electroplated Au—Sn alloy bump over the active surface; and a (glass) substrate comprising conductive traces electrically coupling with the electroplated Au—Sn alloy bump, wherein the electroplated Au—Sn alloy bump has a composition from about $Au_{0.35}Sn_{0.15}$ to about $Au_{0.75}Sn_{0.25}$ in weight percent uniformly distributed from an end in proximity to the active surface to an end in proximity to the substrate. A method of manufacturing a semiconductor package comprises forming patterns of conductive pads on an active surface of a semiconductor chip; electroplating Au—Sn alloy bump over the conductive pads; and bonding the semiconductor chip on a corresponding conductive trace on a substrate by a reflow operation or a thermal press operation.

9 Claims, 16 Drawing Sheets

(51) Int. Cl.

| | |
|---|---|
| *H01L 23/00* | (2006.01) |
| *H01L 21/324* | (2006.01) |
| *C25D 7/12* | (2006.01) |
| *C25D 3/60* | (2006.01) |
| *C25D 3/62* | (2006.01) |
| *C25D 5/50* | (2006.01) |
| *G02F 1/1333* | (2006.01) |
| *H01L 33/62* | (2010.01) |
| *C25D 5/02* | (2006.01) |
| *C23C 18/16* | (2006.01) |

(52) U.S. Cl.
CPC ........... C25D 7/123 (2013.01); G02F 1/1333 (2013.01); H01L 21/324 (2013.01); H01L 24/13 (2013.01); H01L 24/14 (2013.01); H01L 24/16 (2013.01); H01L 24/29 (2013.01); H01L 24/742 (2013.01); H01L 24/81 (2013.01); *C23C 18/1653* (2013.01); *C25D 5/02* (2013.01); *H01L 24/03* (2013.01); *H01L 24/05* (2013.01); *H01L 24/32* (2013.01); *H01L 24/83* (2013.01); *H01L 24/92* (2013.01); *H01L 33/62* (2013.01); *H01L 2224/0345* (2013.01); *H01L 2224/03452* (2013.01); *H01L 2224/03462* (2013.01); *H01L 2224/03464* (2013.01); *H01L 2224/05139* (2013.01); *H01L 2224/05144* (2013.01); *H01L 2224/05155* (2013.01); *H01L 2224/05164* (2013.01); *H01L 2224/05166* (2013.01); *H01L 2224/05639* (2013.01); *H01L 2224/05644* (2013.01); *H01L 2224/05655* (2013.01); *H01L 2224/05664* (2013.01); *H01L 2224/05666* (2013.01); *H01L 2224/06102* (2013.01); *H01L 2224/1145* (2013.01); *H01L 2224/1147* (2013.01); *H01L 2224/11452* (2013.01); *H01L 2224/11462* (2013.01); *H01L 2224/11849* (2013.01); *H01L 2224/13006* (2013.01); *H01L 2224/13007* (2013.01); *H01L 2224/13013* (2013.01); *H01L 2224/13014* (2013.01); *H01L 2224/13139* (2013.01); *H01L 2224/13144* (2013.01); *H01L 2224/13147* (2013.01); *H01L 2224/1403* (2013.01); *H01L 2224/16227* (2013.01); *H01L 2224/2919* (2013.01); *H01L 2224/32225* (2013.01); *H01L 2224/73204* (2013.01); *H01L 2224/81203* (2013.01); *H01L 2224/81447* (2013.01); *H01L 2224/81815* (2013.01); *H01L 2224/83104* (2013.01); *H01L 2224/92125* (2013.01); *H01L 2924/00015* (2013.01); *H01L 2924/014* (2013.01); *H01L 2924/01029* (2013.01); *H01L 2924/01047* (2013.01); *H01L 2924/01079* (2013.01); *H01L 2924/12041* (2013.01); *H01L 2924/2064* (2013.01); *H01L 2924/20107* (2013.01); *H01L 2924/20108* (2013.01)

(58) Field of Classification Search
CPC ....... H01L 2224/16; H01L 2224/13099; H01L 2924/01079; H01L 2924/01078; H01L 2924/15311; H01L 2924/14; H01L 2924/01029; H01L 2924/01013; H01L 2225/06513; H01L 23/488; H01L 2224/03462; H01L 2224/11462
USPC .......... 257/99, 737, 772, 778; 438/539, 584, 438/612, 617, 632, 646, 660, 663, 438/FOR. 297, FOR. 385, FOR. 390, 613
See application file for complete search history.

(56) References Cited

U.S. PATENT DOCUMENTS

| | | | | |
|---|---|---|---|---|
| 5,951,893 | A * | 9/1999 | Bitko | H01L 24/81 219/209 |
| H1934 | H * | 1/2001 | Dautartas | B23K 35/001 148/430 |
| 7,554,201 | B2 * | 6/2009 | Kang | B23K 35/025 257/734 |
| 8,779,604 | B1 * | 7/2014 | Cheng | H01L 24/11 257/737 |
| 2002/0031904 | A1 * | 3/2002 | Shibata | H01L 25/0652 438/615 |
| 2002/0149117 | A1 * | 10/2002 | Shibata | H01L 21/563 257/777 |
| 2004/0201029 | A1 * | 10/2004 | Yamane | H01L 24/83 257/99 |
| 2006/0024863 | A1 * | 2/2006 | Chung | H01L 21/563 438/107 |
| 2006/0237097 | A1 * | 10/2006 | Lau | C23C 22/08 148/242 |
| 2007/0037377 | A1 * | 2/2007 | Richardson | C25D 3/60 438/613 |
| 2007/0269928 | A1 * | 11/2007 | Farooq | B23K 3/0623 438/108 |
| 2010/0301475 | A1 * | 12/2010 | Hsu | H01L 21/6836 257/738 |
| 2011/0006416 | A1 * | 1/2011 | Tseng | H01L 24/11 257/737 |
| 2015/0171039 | A1 * | 6/2015 | Cheng | H01L 23/488 257/737 |
| 2015/0171040 | A1 * | 6/2015 | Thacker | H01L 24/11 257/737 |
| 2015/0340328 | A1 * | 11/2015 | Gandhi | H01L 24/03 257/762 |

* cited by examiner

SEMICONDUCTOR PACKAGE AND METHOD OF MANUFACTURING THEREOF

PRIORITY CLAIM AND CROSS-REFERENCE

This application is a divisional application of U.S. patent application Ser. No. 14/689,491, filed on Apr. 17, 2015.

FIELD

The disclosure relates to Au—Sn alloy bump and the semiconductor structure using Au—Sn alloy bumps.

BACKGROUND

With the recent advancement of the electronics industry, electronic components are being developed to have high performance and thus there is a demand for miniaturized and highly-densified packages. Accordingly, interposers which functions to connect ICs to a main board must be packed more densely. The high densification of packages is attributable to an increase of the number of I/Os of ICs, and the method for the connection with the interposers has also been made more efficient.

The growing popularity of one of the interposer technology is flip-chip bonding. Flip-chip assembly in the fabrication process flow of silicon integrated circuit (IC) devices is driven by several facts. First, the electrical performance of the semiconductor devices can be improved when the parasitic inductances correlated with conventional wire bonding interconnection techniques are reduced. Second, flip-chip assembly provides higher interconnection densities between chip and package than wire bonding. Third, flip-chip assembly consumes less silicon "real estate" than wire bonding, and thus helps to conserve silicon area and reduce device cost. And fourth, the fabrication cost can be reduced, when concurrent gang-bonding techniques are employed rather than consecutive individual bonding steps.

In order to reduce interposers size and its pitch, efforts were undertaken to replace the earlier solder-based interconnecting balls in flip-chip bonding with metal bumps, especially by an effort to create metal bumps by a modified wire ball technique. Typically, the metal bumps are created on an aluminum layer of the contact pads of semiconductor chips. Subsequently, the chips are attached to substrates using solder. The metal bumps are used for flip chip packaging with applications for LCDs, memories, microprocessors and microwave RFICs.

Among different bonding materials, lead-free solder bumps recently attract more attention due to environment concerns rising. Nowadays, different types of materials are used and are further developed, for example, pure tin (Sn), gold-tin (Au—Sn), copper-tin (Cu—Sn), silver-tin (Ag—Sn), etc. Herein, the electroplated Au—Sn bumps are discussed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
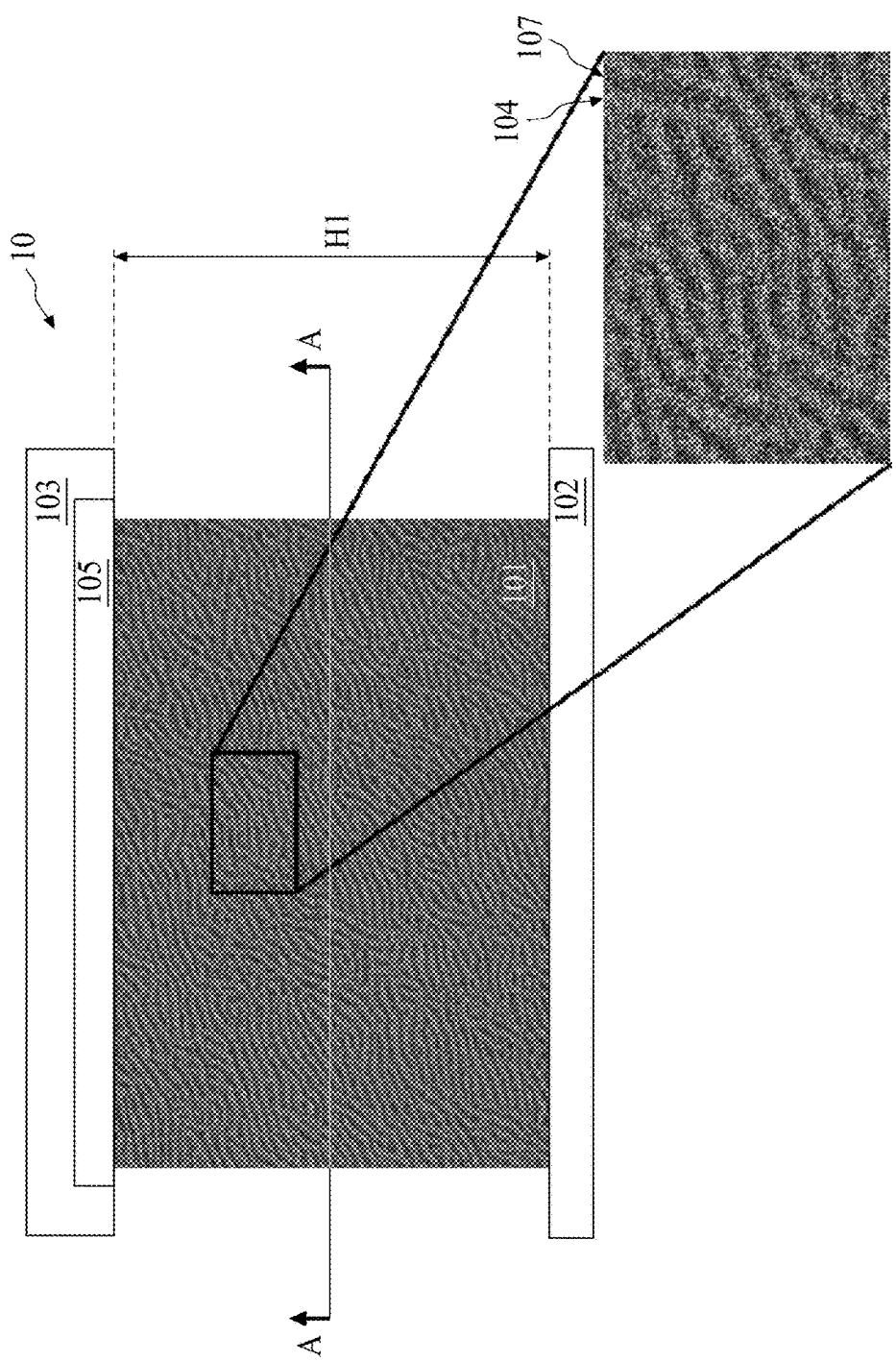
FIG. 1 is a cross sectional view of a simplified semiconductor package with an electroplated Au—Sn alloy bump, in accordance with some embodiments of the present disclosure.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention. It is to be understood that the following disclosure provides many different embodiments or examples for implementing different features of various embodiments. Specific examples of components and arrangements are described below to simplify the present disclosure. These are, of course, merely examples and are not intended to be limiting.

The following disclosure provides many different embodiments, or examples, for implementing different features of the provided subject matter. Specific examples of components and arrangements are described below to simplify the present disclosure. These are merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Among the metal bump technology in semiconductor packaging, gold bumps gained most popularity in that the familiarity to the material properties and processing technology in the art. However, high material cost, inferior bonding reliability and unsatisfactory material properties such as low electrical conductivity and low thermal conductivity remain as problems to be solved. An alternative cost-saving approach to fabricate metal bump is by creating multilayer humps, for example, a Cu (bottom layer), Ni (middle layer) and Au (top layer) bump. This approach saves the gold material consumption for a metal bump but the Cu bottom layer is subject to easy oxidation and corrosion, and thus generates reliability concerns.

Compared to the e-beam evaporation deposition techniques, the electroplated. Au—Sn bump provides a better uniformity in its composition. This is because during the deposition process, the lighter tin atom transports faster compared with the heavier gold atom. As a result, the Au—Sn bump formed by e-beam evaporation has a structure with Sn-rich phase near the deposited surface and an Au-rich phase farther from the deposited surface. The non-uniform composition of the Au—Sn bump, which may result in low reliability, can be solved by the electroplating techniques discussed below.

FIG. 1 is a cross sectional view of a simplified semiconductor package 10 with an electroplated Au—Sn alloy bump 101 between a lower conductive pad 102 and a device 103. In some embodiments, the device 103 includes, but not limited to, active devices such as a memory, a transistor, a diode (PN or PIN junctions), integrated circuits, or a varactor. In other embodiments, the device 103 includes passive devices such as a resistor, a capacitor, or an inductor. In some embodiments, the device 103 includes an upper conductive pad 105 thereon. As shown in FIG. 1, a microstructure of the electroplated Au—Sn alloy bump 101 is shown. For clarification, an enlarged cross section of the electroplated Au—Sn alloy bump 101 is presented on the bottom right corner of FIG. 1 and the microstructure of the electroplated Au—Sn alloy bump 101 is identified on the cross sectional plane by using an electron microscope. In some embodiments, the electroplated Au—Sn alloy bump 101 includes composition with 0.15 to 0.25 weight percent of tin (Sn), and is distributed uniformly between the lower conductive pad 102 and the device 103. As shown in the enlarged picture of FIG. 1, the electroplated Au—Sn alloy bump 101 includes a light phase 104 and a dark phase 107, both having an elongated shape. In some embodiments, a greatest dimension of a cross section parallel to a surface supporting the electroplated Au—Sn alloy bump 101 is within a range of from about 10 µm to about 50 µm in some embodiments, because the electroplated Au—Sn alloy bump 101 is formed by electroplating, both the light phase 104 and the dark phase 107 will be amorphous structures instead of single crystals.

Figure 2B:
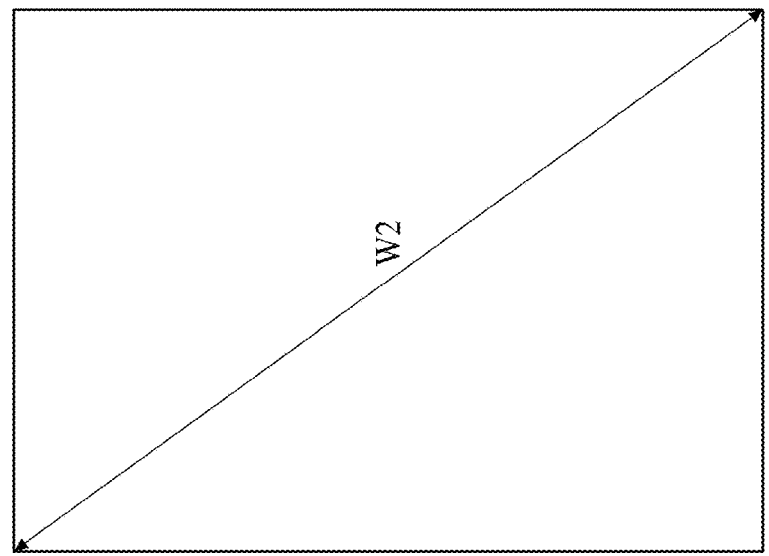
FIG. 2B is a cross section of an electroplated Au—Sn alloy bump parallel to a surface supporting the electroplated Au—Sn alloy bump, in accordance with some embodiments of the present disclosure.
Figure 2A:
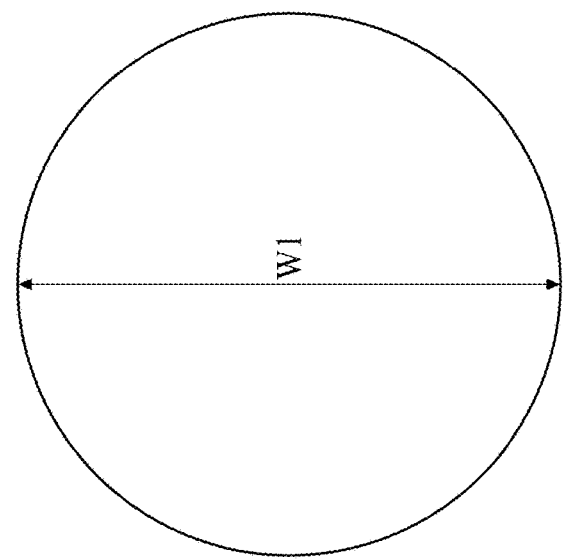
FIG. 2A is a cross section of an electroplated Au—Sn alloy bump parallel to a surface supporting the electroplated Au—Sn alloy bump, in accordance with some embodiments of the present disclosure.

Referring to FIGS. 2A and 2B, respectively, a greatest dimension with a circular shape or a rectangular shape of a cross section parallel to a surface supporting the electroplated Au—Sn alloy bump 101 is shown. The view of the cross section is taken along the AA axis shown in FIG. 1. In some embodiments, the shape of the electroplated Au—Sn alloy bump 101 depends on the shape of the upper conductive pad 105 on top of the device 103. In some embodiments, the width of the electroplated Au—Sn alloy bump 101 is larger than, equal to or smaller than the width of the upper conductive pad 105. In some embodiments, a diameter of a circular cross section of the electroplated Au—Sn alloy bump 101 parallel to a surface supporting the electroplated Au—Sn alloy bump is within a range of from about 10 µm to about 50 µm, as depicted as W1 in FIG. 2A. In some embodiments, a diagonal of a rectangular cross section of the electroplated Au—Sn alloy bump 101 parallel to a surface supporting the electroplated Au—Sn alloy bump is within a range of from about 10 µm to about 50 µm, as depicted as W2 in FIG. 2B.

Figure 3:
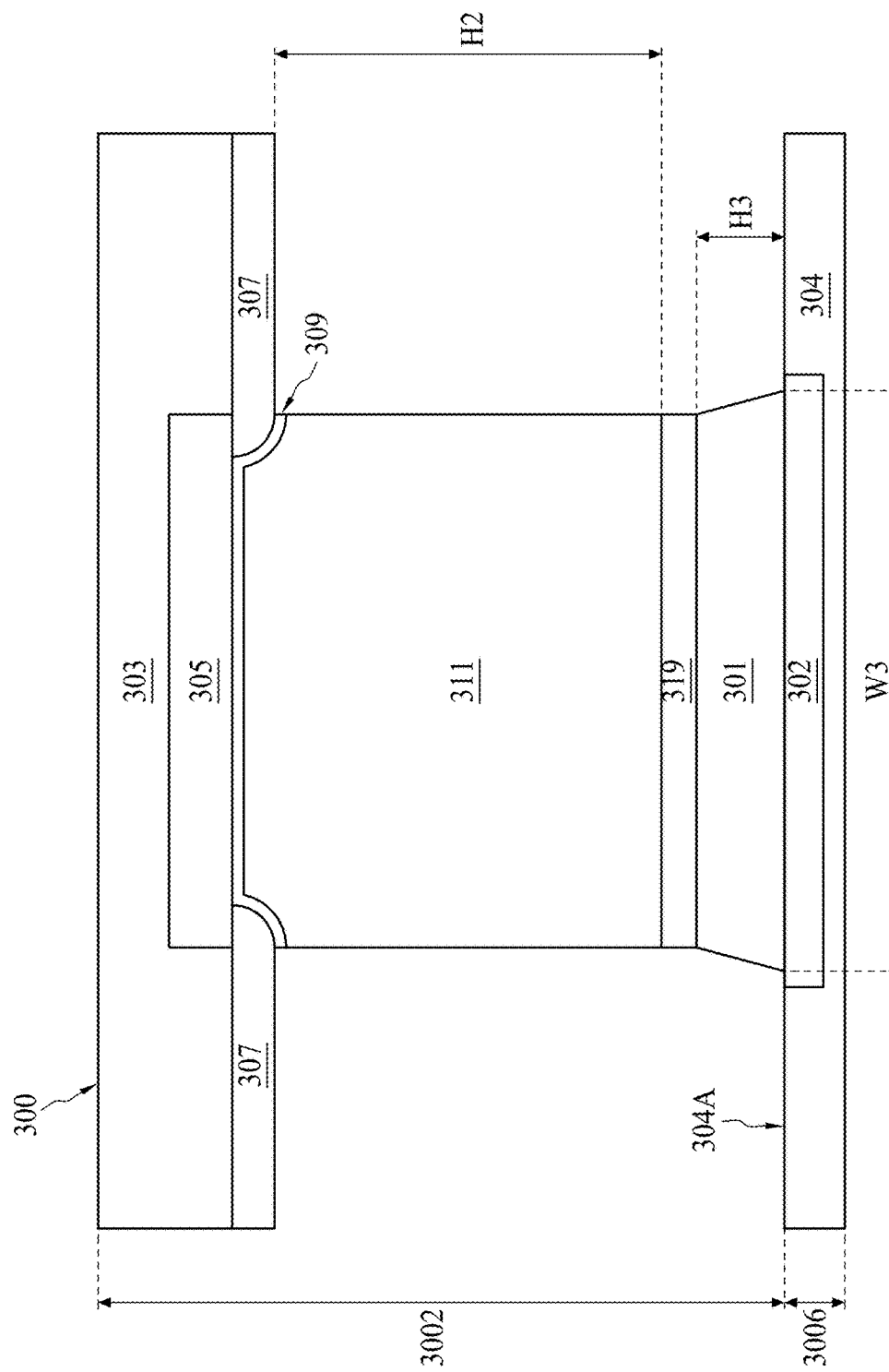
FIG. 3 is a cross section of a semiconductor structure with an electroplated Au—Sn alloy bump in accordance with some embodiments of the present disclosure.

Referring to FIG. 3, a cross section of a semiconductor structure 300 with an electroplated Au—Sn alloy bump 301 in accordance with some embodiments is shown. In some embodiments, the semiconductor structure 300 is a semiconductor package. The semiconductor structure 300 includes a lower portion 3006. The lower portion 3006 includes, but not limited to, a device or simply a substrate 304 depending on the applications, and a lower conductive pad 302 is deposited on the active surface 304A of the substrate. The upper portion 3002 includes a device 303 with an upper conductive pad 305 surrounded by the dielectric 307. Further, the upper portion 3002 further includes an under bump metallization (UBM) layer 309 on top of the upper conductive pad 305 and part of the dielectric 307, and a conductive pillar 311 deposited over the UBM layer 309. In some embodiments, the conductive pillar 311 may include substantially a layer including Au, Cu, Ag, and alloys thereof. In some embodiments, the conductive pillar 311 can be formed by chemical vapor deposition (CVD), sputtering, or electro-chemical plating (ECP). In some embodiments, a height H2 of the conductive pillar 311 is within a range of from about 10 µm to about 40 µm depending on the applications In some embodiments, the UBM layer 309 has a single-layer structure or a composite structure including several sub-layers formed of different materials, and includes a layer(s) selected from a nickel layer, a titanium layer, a titanium tungsten layer, a palladium layer, a gold layer, a silver layer, and combinations thereof. The upper portion 3002 further includes an electroplated Au—Sn alloy bump 301 over the conductive pillar 311. In some embodiments, an intermetallic compound 319 is formed between the conductive pillar 311 and the electroplated Au—Sn alloy bump 301. In some embodiments, the composition of intermetallic compounds (IMC) depends on the materials and their composition ratios made of the bump as well as the conductive pillar over the UBM layer. For example, in some embodiments, the IMC includes binary gold/tin intermetallics $AuSn_4$, or an intermetallic compound layer of $AuSn/AuSn_2$.

As shown in FIG. 3, a height H3 of the electroplated Au—Sn alloy bump 301 is measured from a top surface of the electroplated Au—Sn alloy bump body to a top surface of the semiconductor chip 304, in some embodiments, the height H3 of the electroplated Au—Sn alloy bump 301 or the $Au_{1-x}Sn_x$ alloy having a composition from about x=0.15 to about x=0.25 (in weight percent). In some embodiments, the original height of the as-electroplated Au—Sn alloy bump 301 is in a range of from about 10 µm to about 40 µm. After a first reflow operation, the Au—Sn alloy bump 301 turns soft and forms a curved surface due to surface tension, and the height thereof is increased about 10% of the original height, reaching a range of from about 11 µm to about 44 µm. Subsequently, a second reflow is treated while the Au—Sn alloy bump 301 is in contact with another workpiece for example, a semiconductor device or a substrate, resulting in a 30% reduction in the thickness of the Au—Sn alloy bump 301, reaching a thickness in a range of from about 7 µm to about 31 µm. In some embodiments, the width of the electroplated Au—Sn alloy bump 301 (depicted as W3 in FIG. 3) can be larger, equal to, or smaller than the width of the conductive pillar 311. In some embodiments, a diameter of a circular cross section of the electroplated Au—Sn alloy bump 301 parallel to a surface supporting the electroplated Au—Sn alloy bump is within a range of from about 20 µm to about 50 µm, as depicted as W1 in FIG. 2A. In some embodiments, a diagonal of a rectangular cross section of the electroplated Au—Sn alloy bump 301 parallel to a surface supporting the electroplated Au—Sn alloy bump is within a range of from about 20 µm to about 50 µm, as depicted as W2 in FIG. 2B. Compared to a conventional approach using technique such as evaporation deposition, the electroplated Au—Sn alloy bump has an amorphous structure. Since there will be less internal stress in an amorphous structure, no post-deposition annealing operation is required to reduce the internal stress for the electroplated Au—Sn alloy bump.

Referring to the packaging techniques about the light-emitting diode (LED) structure, it is well known to persons having ordinary skill in the art that the Au bump is conventionally utilized in order to connect the LED structure to a substrate or a device. However, the Au bump provides poor adhesion between the copper wire as conductive traces) on top of a substrate (or a device) and the LED structure partly due to the comparatively great hardness of Au bump, To solve the adhesion problem, a tin film is conventionally formed on top of the copper wire in order to facilitate the adhesion between the conductive traces and the Au bump. Herein, an improved approach is provided by using the electroplated Au—Sn alloy bump as an interface between metal bumps and conductive traces.

Figure 4:
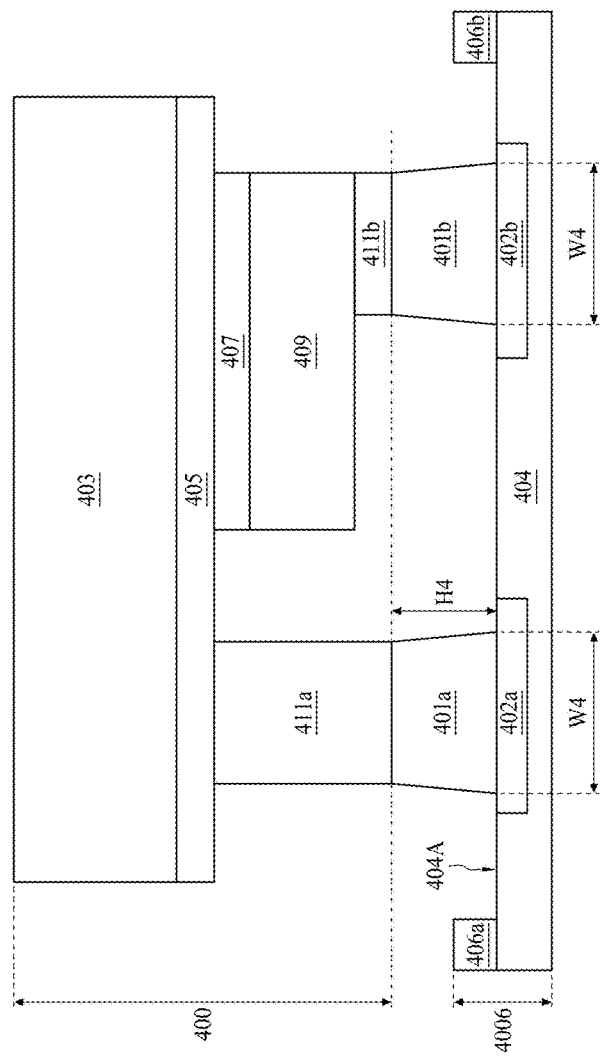
FIG. 4 is a cross sectional view of a light-emitting diode (LED) structure with an electroplated Au—Sn alloy bump in accordance with some embodiments of the present disclosure.

Referring to FIG. 4, a cross section of a light-emitting diode (LED) structure 400 with electroplated Au—Sn alloy bumps 401a and 401b in accordance with some embodiments is shown. The LED structure 400 includes a substrate 403, N-type and P-type GaN layers 405 and 409, a multiple quantum well layer 407 between the N-type GaN layer 405 and the P-type GaN layer 409, an n-type electrode 411a and a p-type electrode 411b. In some embodiments, the substrate may choose from sapphire, glass, or any suitable materials. On top of the substrate 403, an N-type GaN layer 405 is formed. Additionally, a multiple quantum well layer 407 and a P-type GaN layer 409 and a p-type electrode 411b are subsequently deposited over a part of the N-type GaN layer 405. On the other hand, the other part of the N-type GaN layer 405, and an n-type electrode 411a is formed. In some embodiments, a lower portion 4006 is connected with the LED structure 400 via the electroplated Au—Sn alloy bumps 401a and 401b. The lower portion 4006 includes, but not limited to, a device or simply a substrate 404 with an active surface 404A depending on the applications, and conductive pads 402a and 402b, which are respectively bonded to the electroplated Au—Sn alloy bumps 401a and 401b. In some embodiments, the lower portion 4006 may include bond pads 406a and 406b in order to connect to other devices. In some embodiments, the electroplated Au—Sn alloy bumps 401a and 401b include composition with 0.15 to 0.25 weight percent of tin (Sn), and is distributed uniformly between the conductive pad 402a and the n-type electrode 411a as well as the conductive pad 402b and the p-type electrode 411b. In some embodiments, a height H4 of the two electroplated Au—Sn alloy bumps 401a and 401b is in a range of from about 3 µm to about 10 µm, a width W4 of the two electroplated Au—Sn alloy bumps 4012 and 401b is in a range of from 200-600 µm, and a length (the direction into the paper) of the two electroplated Au—Sn alloy bumps 401a and 401b is in a range of from 500-1500 µm. In some embodiments, the width of the electroplated Au—Sn alloy bumps 401a and 401b is equal to or smaller than the width of the n-type electrode 411a and the p-type electrode 411b.

In a flip-chip light-emitting diode (LED) structure 400 in FIG. 4, the n-type electrode 411a and the p-type electrode 411b are made on the same side of the LED structure 400. Therefore, the LED structure 400 includes the n-type electrode 411a and the p-type electrode 411b can be stacked directly on a device or a substrate 404, and thus a reduced package area can be achieved compared to conventional metal wire bonding. Additionally, a connection of Au—Sn alloy bump 4012 and 4010 can be made between the LED structure 400 and conductive pads 402a and 4020 without forming of Sn plating layer, as previously discussed. Furthermore, the electroplated Au—Sn alloy bump 401a and 401b can be utilized alone or in combination with the Au or Ag bump in the LED structure 400, i.e. on top of the Au or Ag bump, which may provide a lower cost of the materials as well as better thermal stability, better endurance to thermal cycles, and better joint performance.

Similar to the problem addressed previously with respect to poor connections between the electrodes of a flip chip LED structure 400 and the conductive traces on a substrate, a chip-on-film (COF) semiconductor structure can have poor adhesion between the chip and the flexible film carrying the chip. The present disclosure provides an electroplated Au—Sn alloy bump which can be used as an interface or a connection body between the chip and the flexible film.

Figure 5:
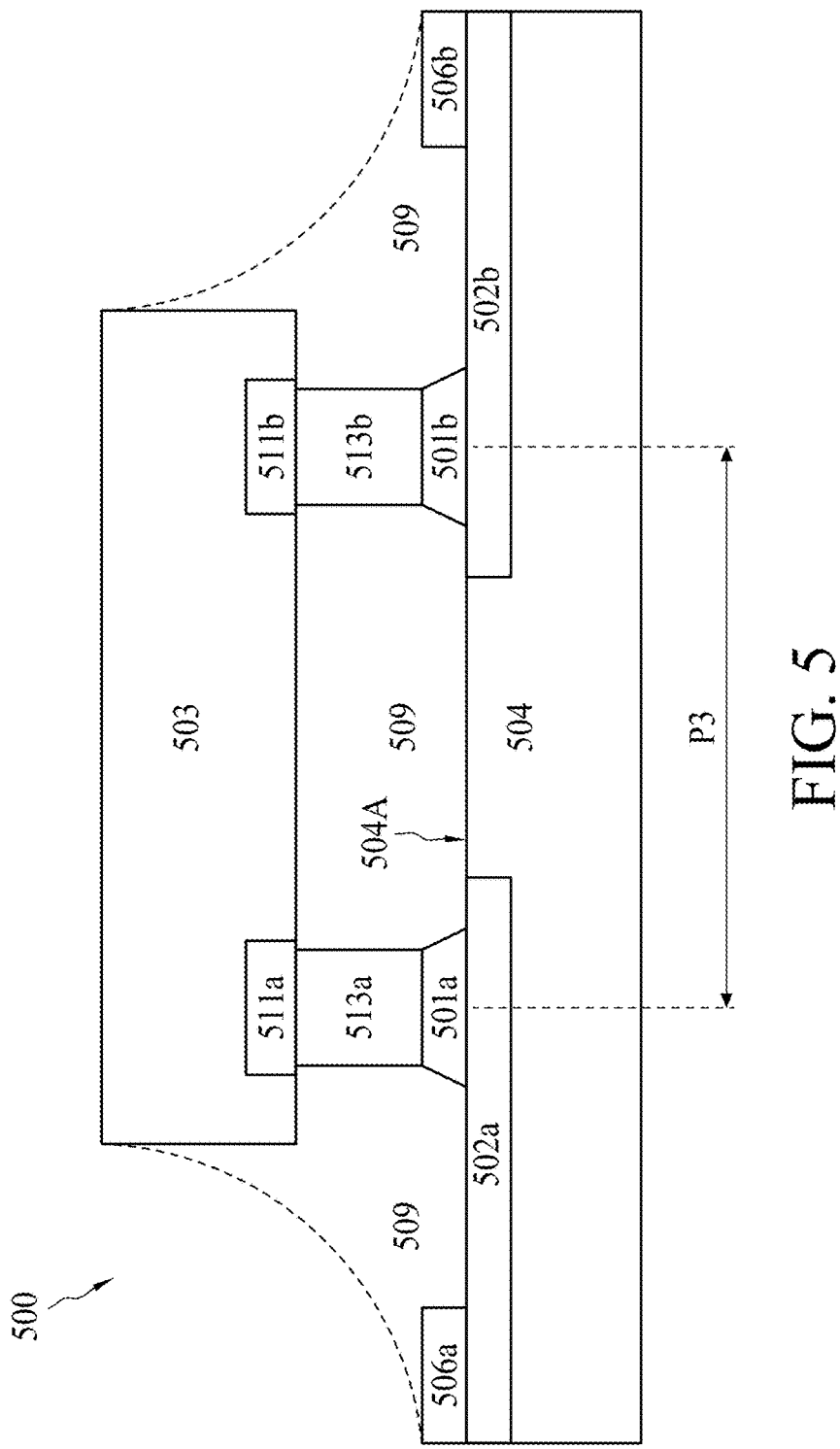
FIG. 5 is a cross section of a chip-on film (COF) semiconductor structure with electroplated Au—Sn alloy bumps in accordance with some embodiments of the present disclosure.

In FIG. 5, a cross section of a chip-on film (COF) semiconductor structure 500 with electroplated Au—Sn alloy bumps is shown. In some embodiments, the semiconductor structure 500 is a semiconductor package. The COF semiconductor structure 500 includes a flexible film 504 which may include, but not limited to, flexible printed circuit board (FPCB) or polyimide (PI). Conductive layers 502a and 502b such as a conductive copper traces are patterned on the active surface 504A of the flexible film 504. Multiple electroplated Au—Sn alloy bumps 501a and 501b on top of the Au or Ag humps 513a and 513b electrically couple the device 503 to the conductive layers 502a and 502b of the flexible film 504 via upper conductive pads 511a and 511b. Alternatively, under bump metallization (UBM) layers can be deposited on top of the upper conductive pads 511a and 511b. In some embodiments, underfill material 509, for example, solventless epoxy resin, with appropriate viscosity is injected into the space between the flexible film 504 and the device 503. In some embodiments, solder resist patterns 506a and 506b are respectively positioned over the conductive layers 502a and 502b to limit the underfill material 509 in a desired position. In some embodiments, underfill material 509 can protect the conductive layers (502a and 502b), and the electroplated Au—Sn alloy bumps (501a and 501b) on top of the flexible film 504. It is also worth noticing that no Sn plating layer is required in the present embodiment on top of the conductive layers 502a and 502b to connect the electroplated Au—Sn alloy bumps (501a and 501b) with the flexible film 504.

In some embodiments, the shape of the electroplated Au—Sn alloy bumps 501a and 501b depends on the shapes of the upper conductive pads 511a and 511b on top of the device 503. In some embodiments, the width of the electroplated Au—Sn alloy bumps 501a and 501b is equal to or smaller than the width of upper conductive pads 511a and 511b In some embodiments, the electroplated Au—Sn alloy bumps 501a and 501b include composition with 0.15 to 0.25 weight percent of tin (Sn) and is distributed uniformly between the conductive layer 502a and the upper conductive pads 511a as well as the conductive layer 502b and the upper conductive pad 511b. In some embodiments, for rectangular Au—Sn alloy bumps 501 and 501b, they will have a width of about or smaller than 30 μm and a length of about or smaller than 17 μm, especially, in the field of liquid crystal display (LCD) application. In some embodiments, a low joining temperature is required to respectively connect the electroplated Au—Sn alloy bumps 501a and 501b and the conductive layers 502a and 502b. The electroplated Au—Sn alloy bump has an eutectic temperature around 280~300 degrees Celsius. In other words, the temperature at the joining point (i.e. the interface between the Au—Sn alloy bump and the flexible substrate) shall be controlled at around 280~300 degrees Celsius. Accordingly, for a chip-on film (COF) semiconductor structure, the flexible substrate would not be deformed by the high temperature and a good reliability of the device performance can be obtained.

Additionally, the electroplated Au—Sn alloy bump can be applied to a chip-on-glass (COG) structure. Conventionally, an anisotropic conductive film (ACF) is positioned between a glass substrate and Au or Ag bump on the semiconductor chip. Subsequently, the ACF is processed under high temperature so that the glass substrate and the semiconductor chip are electrically connected to each other. The ACF is generally composed of an adhesive polymer matrix and fine conductive fillers using metallic particles or metal-coated polymer balls. The limiting factor of ACF is that a threshold concentration of fine conductive fillers is required in order to make sure a good electrical connection. However, the reliability and contact resistance of the packing structure may be affected since it is difficult to control the deformation of compressed fine conductive fillers dominating the conductivity characteristics, especially when the size of the integrated circuit continues to scale down. In addition to add production cost of a semiconductor package, ACF is prone to form an open circuit since the fine conductive fillers may be gathered in certain regions instead of distributed uniformly. The smaller size of the device may cause a low flowability of the fine conductive fillers in the ACF. In the following paragraphs, the use of electroplated Au—Sn alloy bumps with an improved design in the COG structure is applied in order to solve the aforementioned issues.

Figure 6:
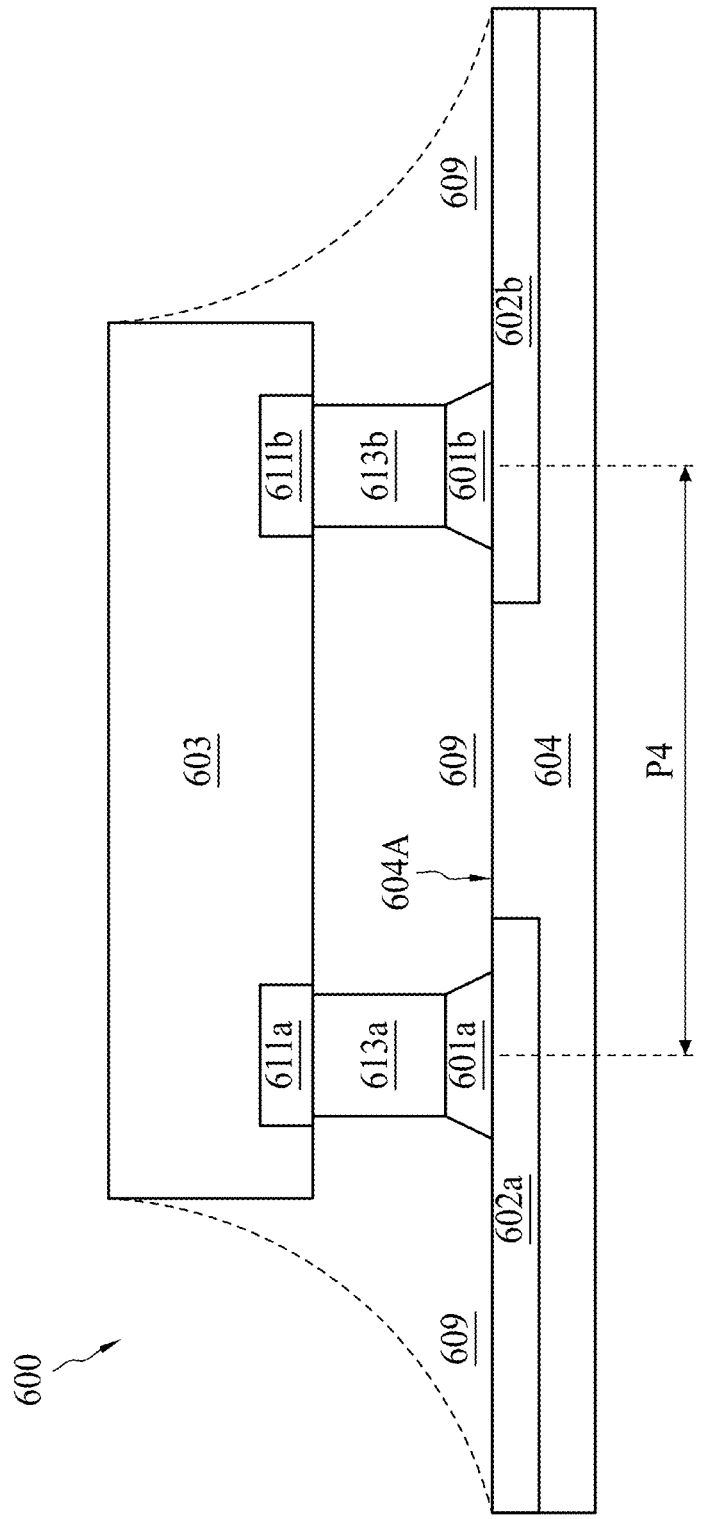
FIG. 6 is a cross section of a chip-on glass (COG) semiconductor structure with electroplated Au—Sn alloy bumps in accordance with some embodiments of the present disclosure.

In some embodiments of the present disclosure, as shown in FIG. 6, the electroplated Au—Sn alloy bumps 601a and 601b discussed herein are used in a COG semiconductor structure 600. The electrical connection between the conductive layers 602a and 602b of a glass substrate 604 with an active surface 604A and the electroplated Au—Sn alloy bumps 601a and 601b on top of the Au or Ag bumps 613a and 613b of a semiconductor chip 603 can be packaged without an ACF therebetween. On the other hand, in some embodiments, underfill material 609 can be used to connect the electroplated Au—Sn alloy bumps 601 and 601b and the conductive layers 602a and 602b. In some embodiments, underfill material 609, for example, solventless epoxy resin, with appropriate viscosity is injected into the space between the glass substrate 604 and the semiconductor chip 603 as to protect the conductive layers (602a and 602b), the Au—Sn alloy bumps (601a and 601b), and the Au or Ag bumps 613a and 613b. In some embodiments, underfill material 609, which is delineated in dotted lines, can be optional. It is also worth noticing that no tin film is required in the present embodiment on top of the conductive layers 602a and 602b to connect the electroplated Au—Sn alloy bumps (601a and 601b) with the glass substrate 604.

In some embodiments, the shape of the electroplated Au—Sn alloy bumps 601a and 601b depends on the shapes of the upper conductive pads 611a and 611b over the semiconductor chip 603. In some embodiments, the width of the electroplated Au—Sn alloy humps 601a and 601b is equal to or smaller than the width of upper conductive pads 611a and 611b. Additionally, the sizes of the electroplated Au—Sn alloy bumps 601a and 601b can be varied depending on various applications. Compared with the Au or Ag bumps, the Au—Sn alloy bump, in a form of an interfacial coating or a connection body, provides better thermal stability, better endurance to thermal cycles, and better joint performance.

Figure 7A:
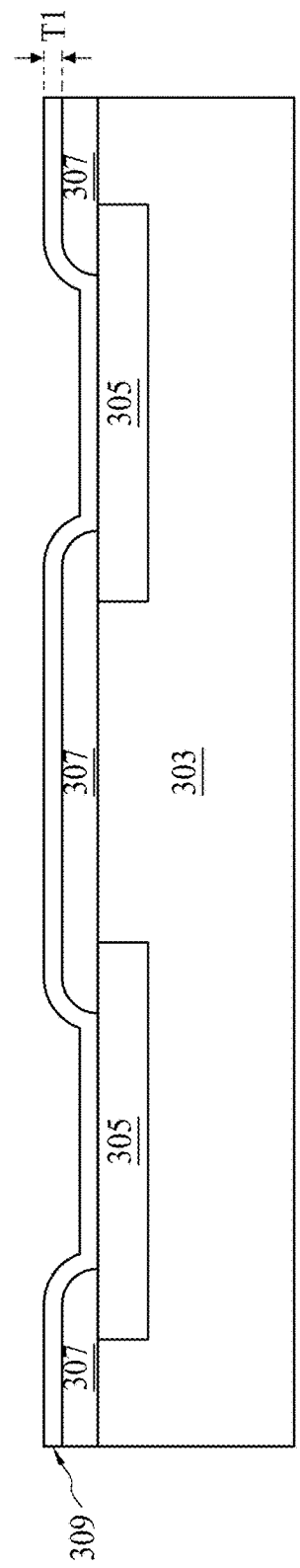
FIG. 7A to FIG. 7F show the manufacturing operations of the semiconductor structure with electroplated Au—Sn alloy bumps illustrated in FIG. 3.

FIG. 7A to FIG. 7F show the manufacturing operations of the semiconductor structure with electroplated Au—Sn alloy bumps illustrated in FIG. 3. In FIG. 7A, the upper conductive pads 305 and part of the dielectric 307 are over a device 303. Then, a UBM layer 309 is formed on the upper conductive pads 305 and part of the dielectric 307. In some embodiments, the UBM layer 309 is formed by CVD, sputtering, electroplating, or electroless plating of the materials selected from nickel, titanium, titanium tungsten, palladium, gold, silver, and the combination thereof. In some embodiments, a thickness T1 of the UBM layer 309 is controlled to be in a range of from about 1000 Å to about 3000 Å. In some embodiments, a seed layer (not shown for simplicity) is deposited on the UBM layer 309, in some embodiments, the topmost layer of the UBM layer can be used as a seed layer. In some embodiments, the seed layer is formed by CVD, sputtering, electroplating, or electroless plating.

Figure 7B:
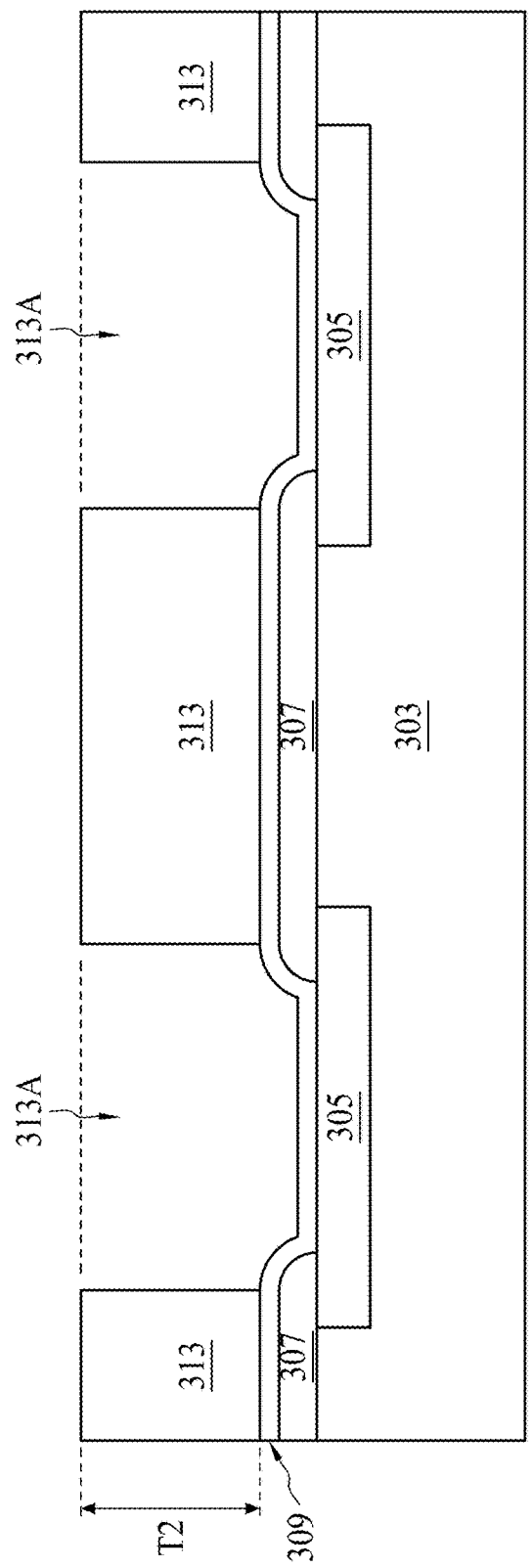

Referring to FIG. 7B, first mask layers 313, which can be a hard mask or a photoresist, are formed over the UBM layer 309. Openings 313A of the first mask layers 313 are formed over the upper conductive pads 305 for receiving conductive bump materials. In some embodiments, the first mask layers 313 are made of positive photoresist having a thickness T2 greater than a thickness of the conductive bump to be plated. In other embodiments, the first mask layers 313 are made of negative photoresist.

Figure 7C:
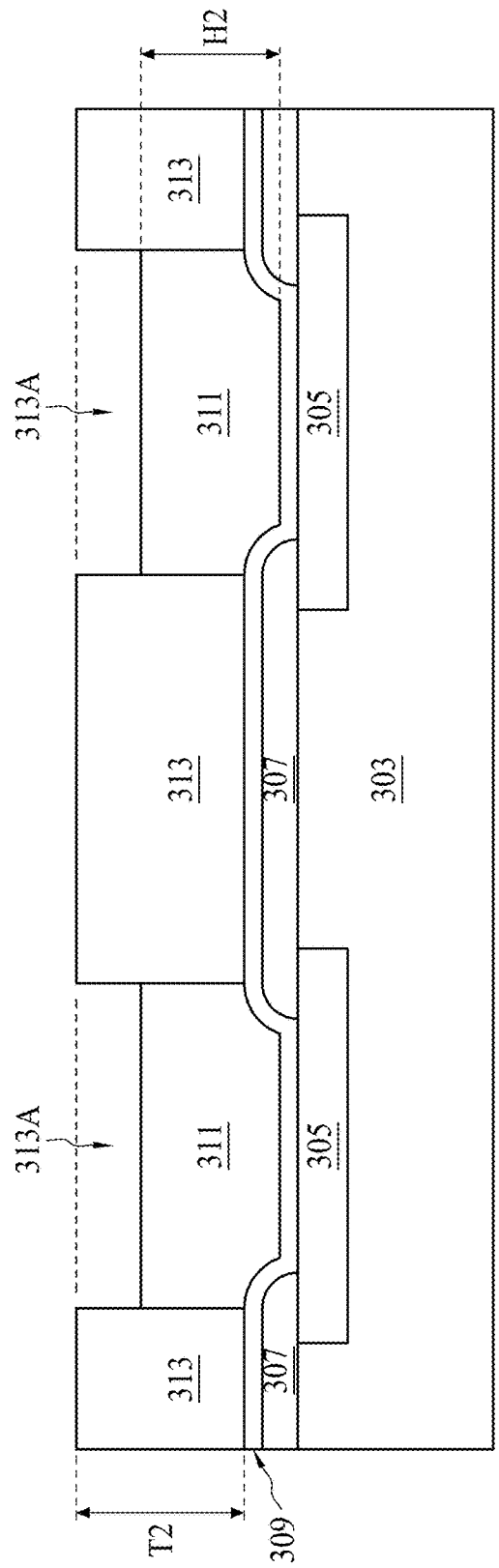

Referring to FIG. 7C, the conductive pillars 311 can be formed over the openings 313A. The material of the conductive pillars 311 may include pure copper or copper alloys. In some embodiments, the conductive pillars 311 can be formed by chemical vapor deposition (CVD), sputtering, or electro-chemical plating (ECP). In some embodiments, a height H2 of the conductive pillar 311 is within a range of from about 10 μm to about 40 μm depending on the application.

Figure 7D:
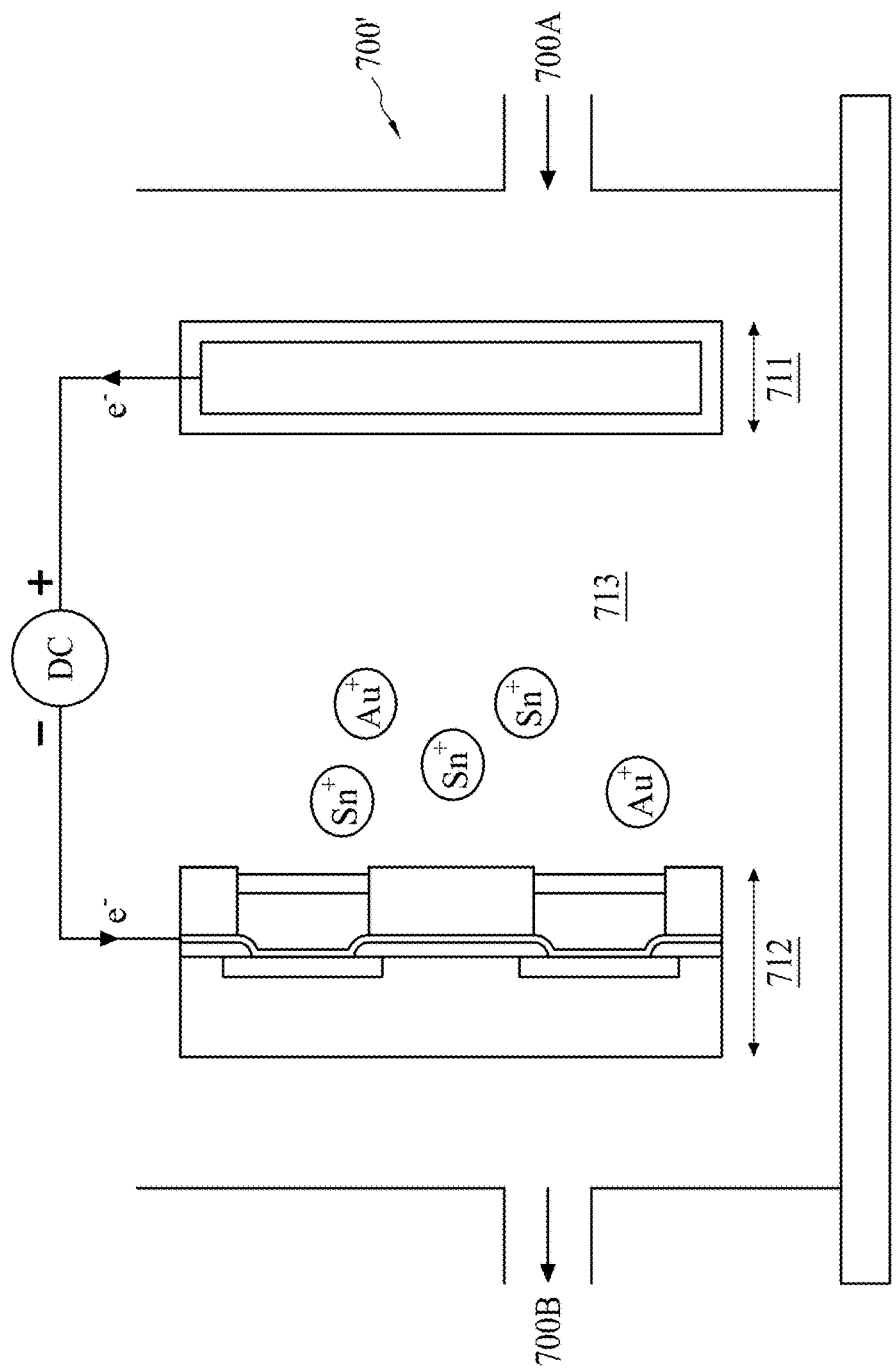
Figure 7E:
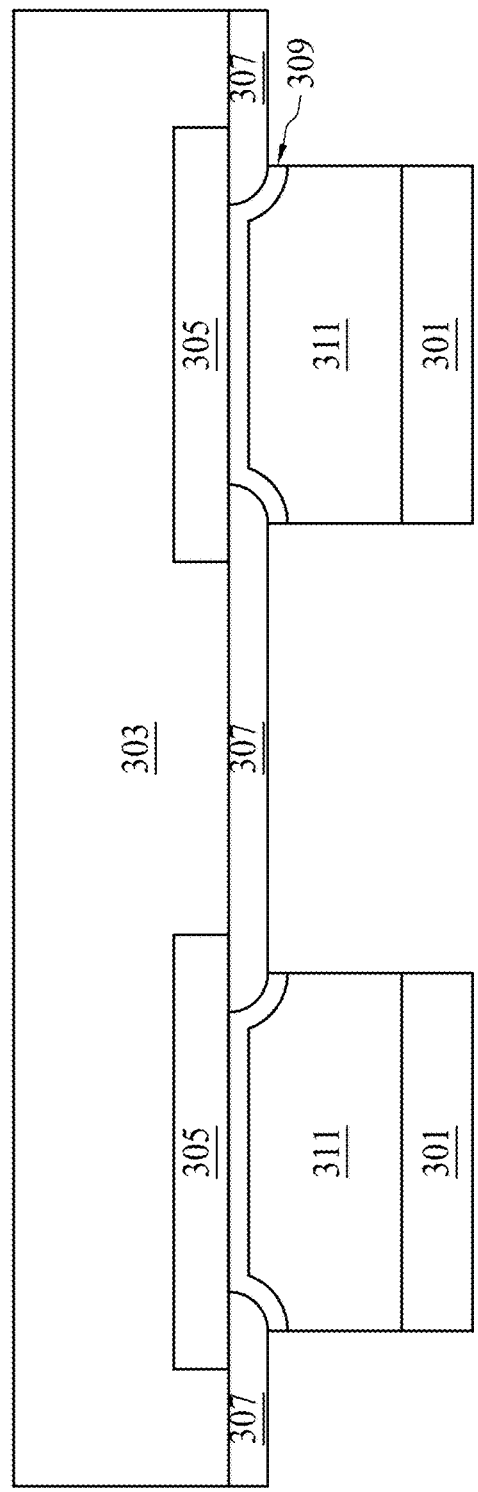

FIG. 7D and FIG. 7E show the electroplating operation and the result thereafter. FIG. 7D shows an electroplating system which includes a container 700' accommodating electroplating bath 713, an anode 711, and a cathode 712. In some embodiments, the anode 711 is insoluble and can be made of Pd-coated titanium, a device 303 with an upper conductive pad 305 surrounded by the dielectric 307 is positioned at the cathode 712, with the conductive pillars 311 formed in the openings 313A. The electroplating bath 713 contains Au—Sn electrolyte plating solution. In some embodiments, the pH value of the electroplating bath 713 is controlled from about 4 to about 6. A temperature of the electroplating bath 713 is controlled to be around 35 to 60 degrees Celsius. In some embodiments, the temperature of the electroplating bath 713 can be maintained by a thermal plate (not shown) positioned under the container 700'. In other embodiments, the temperature of the electroplating bath 713 can be maintained by an electroplating solution circulation system in which an outlet 700B discharges the electroplating solution and an inlet 700A intakes the temperature-controlled electroplating solution. In some embodiments, a current density of a direct current (DC) applied for electroplated Au—Sn alloy bumps plating is in a range of from about 0.2 ASD to about 1.0 ASD. In some embodiments, a rate of electroplating Au—Sn alloy bump is controlled in a range of from about 0.2 μm/min to about 0.4 m/min. It is noted that the rate of electroplating the Au—Sn alloy bump is faster than that of the evaporation method (generally, the deposition rate of evaporation for Au—Sn bump is about 0.06 μm/min, and the deposition rate of electroplating for Au—Sn alloy bump is about 0.3 μm/min. A higher manufacturing throughput can be obtained by using electroplating operation. In some embodiments, a positive end of the external DC current is connected to the anode 711 and a negative end of the external DC current is connected to the cathode 712. As can be seen in FIG. 7D, the reduced gold ions and reduced tin ions fill the openings 313A defined by the first mask layer 313 and form Au—Sn binary alloy on top of the conductive pillar 311. After the Au—Sn alloys being deposited on top of the conductive pillar 311, as shown in FIG. 7D, the device 303 is then removed from the electroplating bath.

FIG. 7E shows a device 303 after completion of the electroplating operation shown in FIG. 7D. In FIG. 7E, the electroplated Au—Sn alloy bumps 301 are formed over the conductive pillars 311. In some embodiments, the height of the electroplated Au—Sn alloy bump 301 is in a range of from about 7 μm to about 31 μm. In some embodiments, the first mask layers 313 are stripped if photoresist is used, as shown in FIG. 7E. The UBM layer 309 not covered by the electroplated Au—Sn alloy bumps 301 is removed by an etching operation to isolate electroplated Au—Sn alloy bumps 301.

Figure 7F:
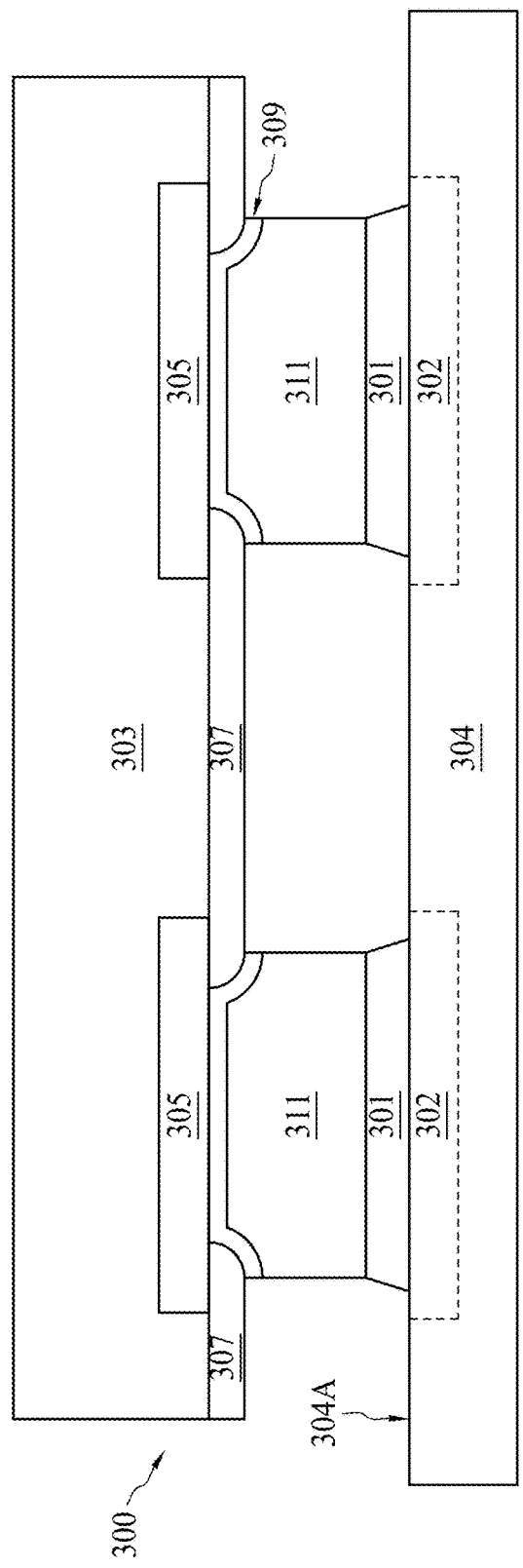

FIG. 7F shows the completed structure of a semiconductor structure 300 with electroplated Au—Sn alloy bumps 301 electrically coupled to the lower conductive pads 302 on an active surface 304A of a device or a substrate 304 depending on the applications. In some embodiments, bonding the semiconductor structure 300 on the corresponding lower conductive pads 302 includes heating the semiconductor structure 300 to achieve a temperature at an interface between the Au—Sn alloy bump 301 and the conductive pad 302 of from about 280 degrees Celsius to about 320 degrees Celsius. In some embodiments, no annealing operation is conducted after the electroplating operation and before the bonding operation.

Figure 8A:
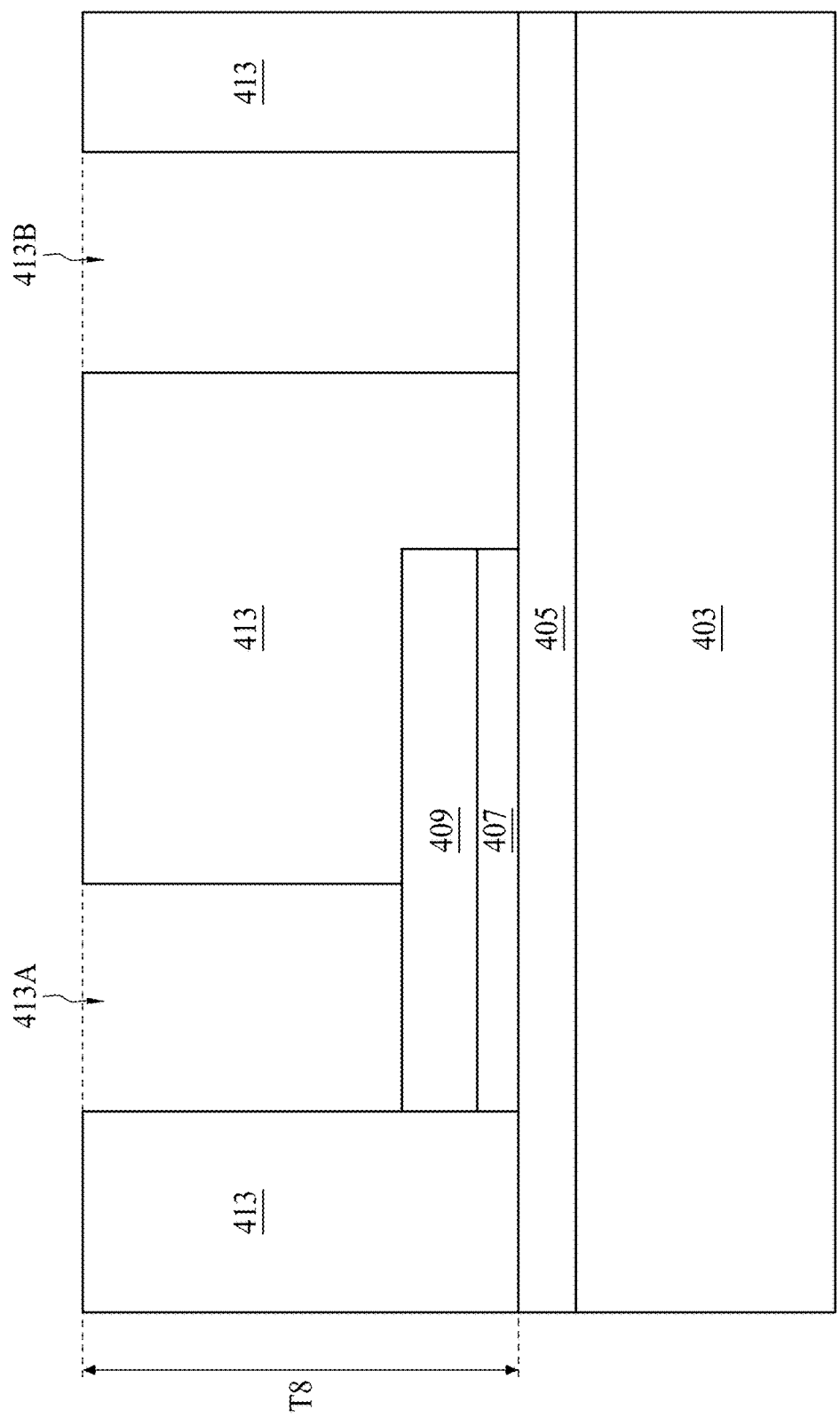
FIG. 8A to FIG. 8D show the manufacturing operations of the light-emitting diode (LED) structure with electroplated Au—Sn alloy bumps illustrated in FIG. 4.
Figure 8B:
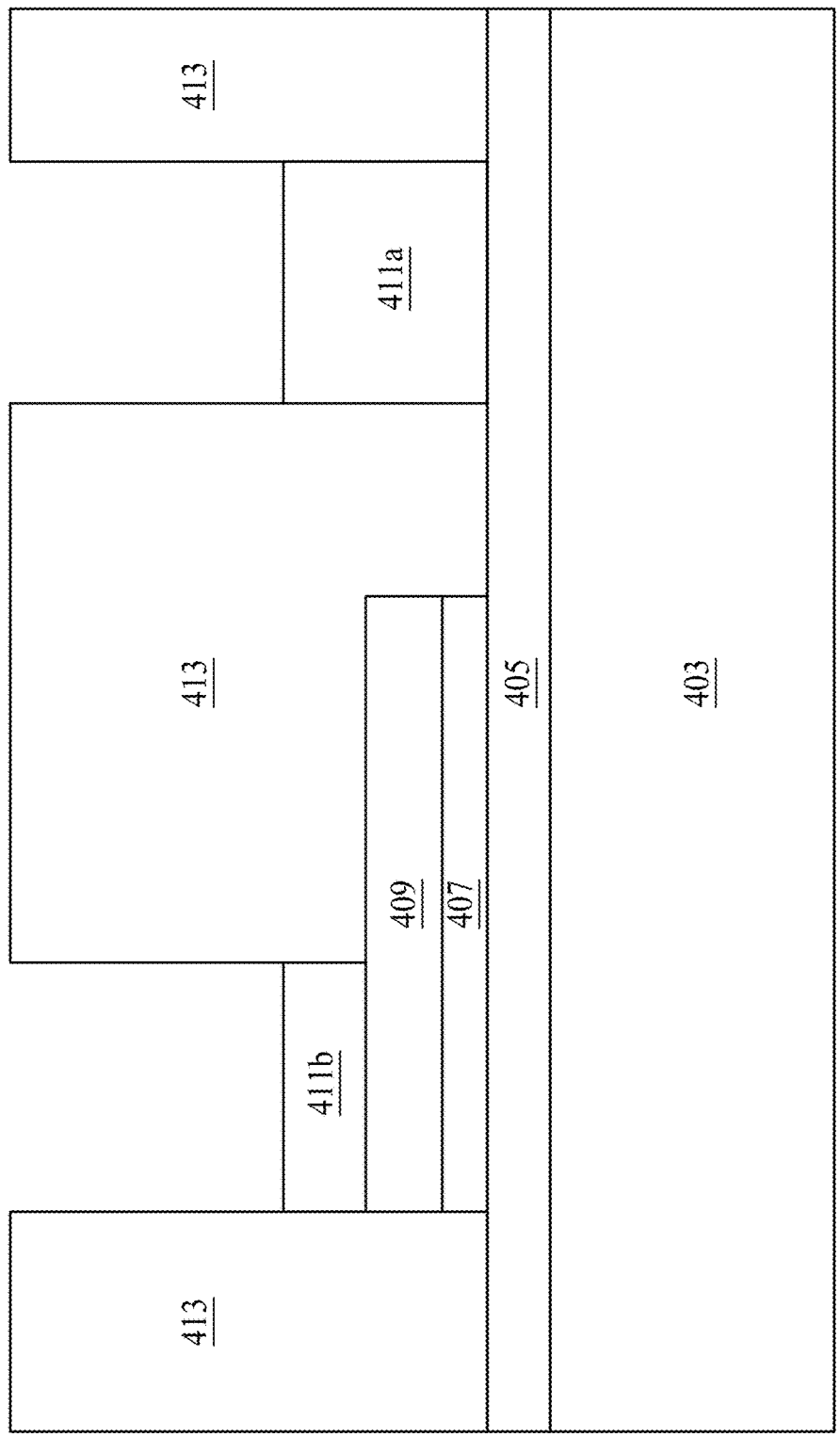

FIG. 8A to FIG. 8D show the manufacturing operation of the LED structure with electroplated Au—Sn alloy bumps illustrated in FIG. 4. In FIG. 8A, an N-type GaN layer 405 is formed over a substrate 403. Then, a multiple quantum well layer 407 and a P-type GaN layer 409 are subsequently deposited on the N-type GaN layer 405. For simplicity, the details for patterning the multiple quantum well layer 407 and the P-type GaN layer 409 is omitted. In some embodiments, the N-type GaN layer 405, the multiple quantum well layer 407 and the P-type GaN layer 409 are formed by CVD, physical vapor deposition (PVD) or sputtering. In some embodiments, the materials can be made of GaAs, GaN, or any suitable materials. Again referring to FIG. 8A, first mask layers 413, which can be a hard mask or a photoresist, are formed over the P-type GaN layer 409 or the N-type GaN layer 405. An opening 413A of the first mask layers 413 is formed over the P-type GaN layer 409, and an opening 413B of the first mask layers 413 is formed over the N-type GaN layer 405 for receiving conductive bump materials. In some embodiments, the first mask layer 413 is made of positive photoresist having a thickness T8 greater than a thickness of the conductive bump to be plated. In other embodiments, first mask layers 413 is made of negative photoresist. As shown in FIG. 8B, an n-type electrode 411a and a p-type electrode 411b are respectively deposited on top of the N-type GaN layer 405 or the P-type GaN layer 409.

Figure 8C:
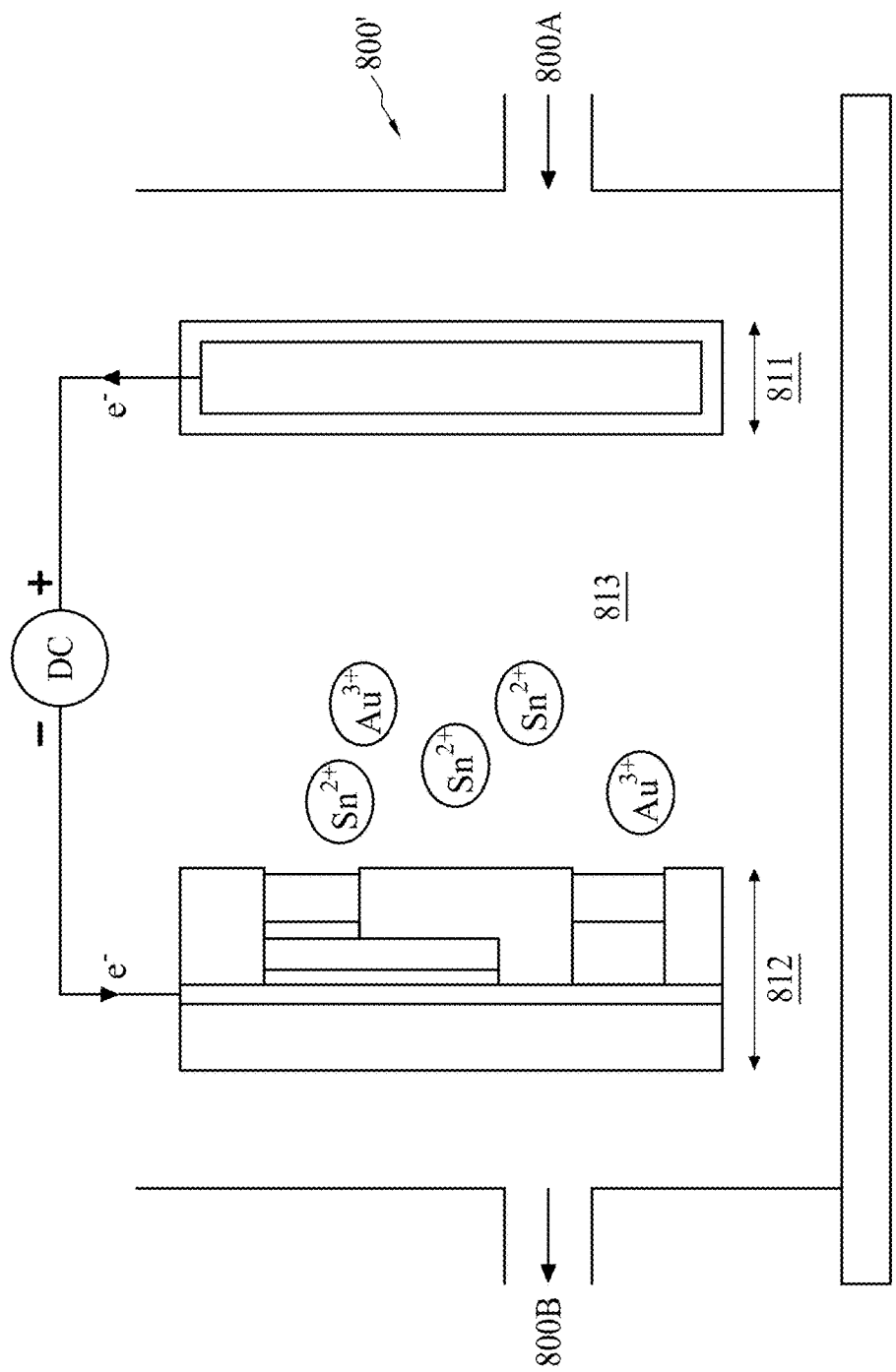
Figure 8D:
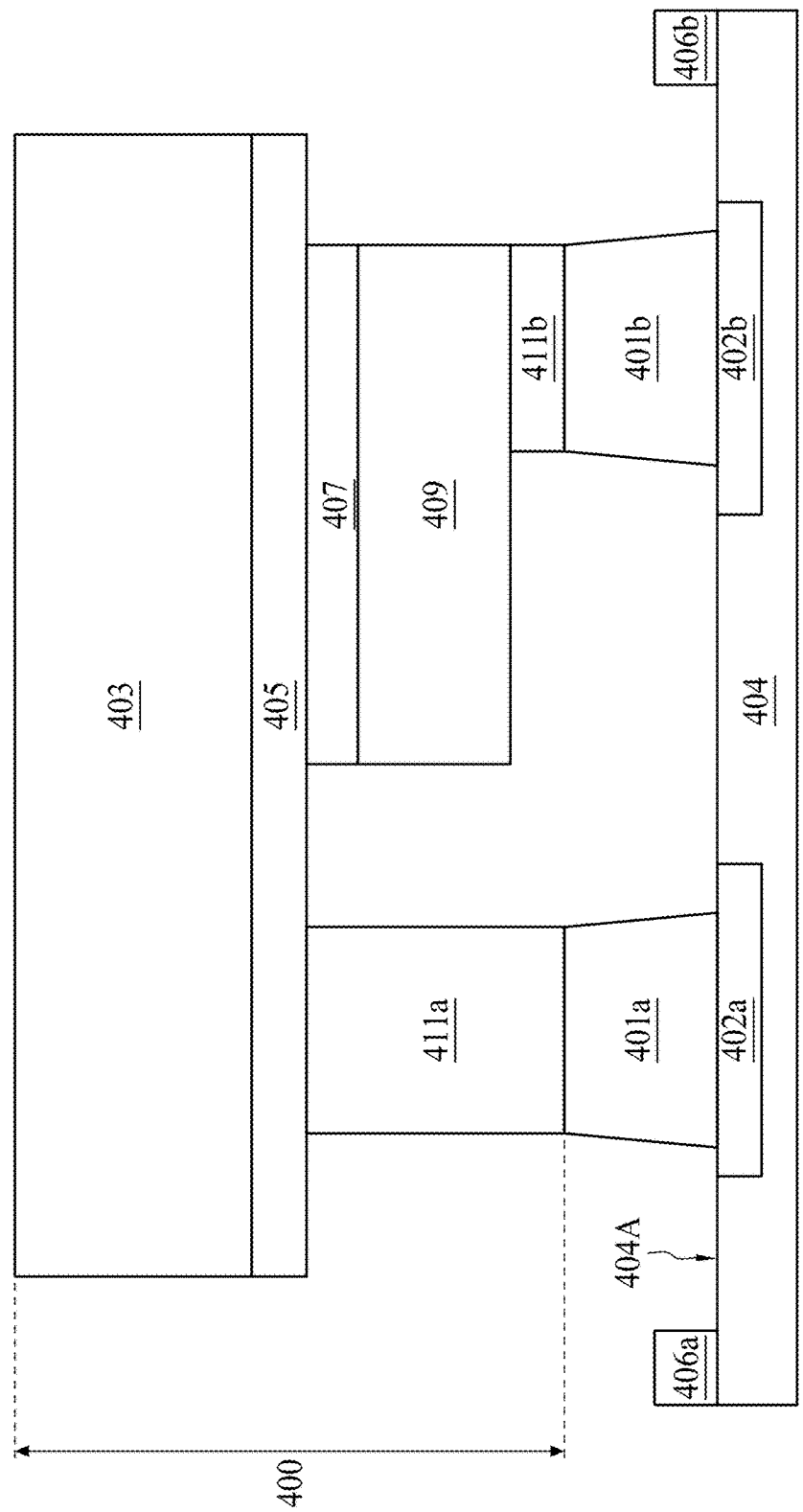

FIG. 8C and FIG. 8D show the electroplating operation and the result thereof. FIG. 8C shows an electroplating system which includes a container 800' accommodating electroplating bath 813, an anode 811, and a cathode 812. In some embodiments, the anode 811 is insoluble and can be made of palladium-coated titanium, a LED structure with the n-type electrode 411 and the p-type electrode 411b is positioned at the cathode 812. The electroplating bath 813 contains Au—Sn electrolyte plating solution. In some embodiments, the pH value of the electroplating bath 813 is controlled under weak acidic condition, for example, from about 4 to about 6. A temperature of the electroplating bath 813 is controlled to be around 35 to 60 degrees Celsius. In some embodiments, the temperature of the electroplating bath 813 can be maintained by a thermal plate (not shown) positioned under the container 800'. In other embodiments, the temperature of the electroplating bath 813 can be maintained by an electroplating solution circulation system in which an outlet 800B discharges the electroplating solution and an inlet 800A intakes the temperature-controlled electroplating solution. In some embodiments, a current density of a direct current (DC) applied for electroplated Au—Sn alloy humps plating is in a range of from about 0.2 ASD to about 1.0 ASD. In some embodiments, a rate of electroplating Au—Sn alloy bump is controlled in a range of from about 0.2 μm/min to about 0.4 μm/min. In some embodiments, a positive end of the external DC current is connected to the anode 811 and a negative end of the external DC current is connected to the cathode 812. As can be seen in FIG. 8C, the reduced gold ions and reduced tin ions are deposited onto the n-type electrode 411a and the p-type electrode 411b of the light-emitting structure 400, filling the openings 413A and 413B defined by the first mask layer 413 and forming Au—Sn binary alloy on top of the n-type electrode 411a and the p-type electrode 411b. After the Au—Sn alloys being deposited onto the n-type electrode 411a and the p-type electrode 411b of the LED structure 400, as shown in FIG. 8C, the light-emitting structure 400 is then removed from the electroplating bath.

FIG. 8D shows the LED structure 400 after completion of the electroplating operation shown in FIG. 8C. In FIG. 8D, the electroplated Au—Sn alloy bumps 401a and 401b are respectively formed over the n-type electrode 411a and the type electrode 411b. In some embodiments, the first mask layers 413 are stripped if photoresist is used, as shown in FIG. 8D. The P-type GaN layer 409 or the N-type GaN layer 405 not covered by the electroplated Au—Sn alloy bumps 401a and 401b are removed by an etching operation to isolate electroplated Au—Sn alloy bumps 401a and 401b. Furthermore, FIG. 8D shows the completed structure of a LED structure 400 with the electroplated Au—Sn alloy bumps 401a and 401b electrically coupled to the conductive pads 402a and 402b on an active surface 404A of a device or a substrate 404 depending on the applications. In some embodiments, bonding the LED structure 400 on the corresponding lower conductive pads 402a and 402b includes heating the LED structure 400 with electroplated Au—Sn alloy bumps to achieve a temperature at an interface between the electroplated Au—Sn alloy bumps 401a and 401b and the conductive pads 402a and 402b of from about 280 degrees Celsius to about 320 degrees Celsius. In some embodiments, no annealing operation is conducted after the electroplating operation and before the bonding operation.

In some embodiments of the present disclosure, a semiconductor package includes a semiconductor chip having an active surface with a conductive pad thereon; an electroplated Au—Sn alloy bump over the active surface; and a substrate comprising conductive traces electrically coupling with the electroplated Au—Sn alloy bump.

In some embodiments of the present disclosure, the electroplated Au—Sn alloy bump has a composition from about $Au_{0.85}Sn_{0.15}$ to about $Au_{0.75}Sn_{0.25}$ in weight percent uniformly distributed from an end in proximity to the active surface to an end in proximity to the substrate.

In some embodiments of the present disclosure, a conductive pillar is between the electroplated Au—Sn alloy bump and the conductive pad.

In some embodiments of the present disclosure, a height of the electroplated Au—Sn alloy bump is in a range of from about 7 μm to about 31 μm.

In some embodiments of the present disclosure, an intermetallic compound is between the conductive pillar and the electroplated Au—Sn alloy bump.

In some embodiments of the present disclosure, the conductive pad is an electrode and the electroplated Au—Sn alloy bump is between the electrode and the conductive traces.

In some embodiments of the present disclosure, the semiconductor chip is a light-emitting diode (LED).

In some embodiments of the present disclosure, the conductive pad is a p-type electrode and another conductive pad is an n-type electrode, and the electroplated Au—Sn alloy bump is between the p-type electrode and the conductive traces and another electroplated Au—Sn bump is between the n-type electrode and the conductive traces.

In some embodiments of the present disclosure, a height of the two electroplated Au—Sn alloy bumps is in a range of from about 3 μm to about 10 μm, a width of the two electroplated Au—Sn alloy bumps is in a range of from 200-600 μm, and a length of the two electroplated Au—Sn alloy bumps is in a range of from 500-1500 μm.

In some embodiments of the present disclosure, the semiconductor package is a chip-on-film (COF) package.

In some embodiments of the present disclosure, the semiconductor package is a chip-on-glass (COG) package.

In some embodiments of the present disclosure, a semiconductor package includes a semiconductor chip having an active surface with a conductive pad thereon; an electroplated Au—Sn alloy bump over the active surface; and a glass substrate comprising conductive traces electrically coupling with the electroplated Au—Sn alloy bump.

In some embodiments of the present disclosure, the electroplated Au—Sn alloy bump has a composition from about $Au_{0.85}Sn_{0.15}$ to about $Au_{0.75}Sn_{0.25}$ in weight percent uniformly distributed from an end in proximity to the active surface to an end in proximity to the glass substrate.

In some embodiments of the present disclosure, a conductive pillar is between the electroplated Au—Sn alloy bump and the conductive pad.

In some embodiments of the present disclosure, no anisotropic conductive film (ACF) is positioned between the semiconductor chip and the glass substrate.

In some embodiments of the present disclosure, an intermetallic compound is between the conductive pillar and the electroplated Au—Sn alloy bump.

In some embodiments of the present disclosure, each of the conductive pillars is made of a material selected from a group consisting of Au, Cu, Ag, and alloys thereof.

In some embodiments of the present disclosure, a method of manufacturing a semiconductor package includes forming patterns of conductive pads on an active surface of a semiconductor chip; electroplating Au—Sn alloy bump over the conductive pads; and bonding the semiconductor chip on a corresponding conductive trace on a substrate by a reflow operation or a thermal press operation.

In some embodiments of the present disclosure, the method for electroplating Au—Sn alloy bump includes immersing the semiconductor chip in a Au—Sn electroplating bath; controlling current density flowing through the Au—Sn electroplating bath within a range of form about 0.2 ASD to about 1.0 ASD; and maintaining a temperature of the Au—Sn electroplating bath within a range of from about 35 degrees Celsius to about 60 degrees Celsius.

In some embodiments of the present disclosure, a rate of electroplating Au—Sn alloy bump is controlled in a range of from about 0.2 μm/min to about 0.4 m/min.

In some embodiments of the present disclosure, bonding the semiconductor chip on the corresponding conductive trace comprises heating the semiconductor chip to achieve a temperature at an interface between the Au—Sn alloy bump and the conductive trace of from about 280 degrees Celsius to about 320 degrees Celsius.

In some embodiments of the present disclosure, no annealing operation is conducted after the electroplating operation and before the bonding operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, and composition of matter, means, methods and steps described in the specification. As those skilled in the art will readily appreciate form the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure.

Accordingly, the appended claims are intended to include within their scope such as processes, machines, manufacture, and compositions of matter, means, methods or steps. In addition, each claim constitutes a separate embodiment, and the combination of various claims and embodiments are within the scope of the invention.

What is claimed is:

1. A method of manufacturing a semiconductor package, comprising:
    forming patterns of conductive pads on an active surface of a semiconductor chip;
    electroplating Au—Sn alloy bumps over the conductive pads at a rate of within a controlled range from about 0.2 μm/min to about 0.4 μm/min; and
    bonding the semiconductor chip on corresponding conductive traces on a substrate by a reflow operation or a thermal press operation.

2. The method of claim 1, wherein the electroplating Au—Sn alloy bumps as recited in claim 1 comprises:
    immersing the semiconductor chip in an Au—Sn electroplating bath;
    controlling current density flowing through the Au—Sn electroplating bath within a range of from about 0.2 ASD to about 1.0 ASD; and
    maintaining a temperature of the Au—Sn electroplating bath within a range of from about 35 degrees Celsius to about 60 degrees Celsius.

3. The method of claim 1, wherein bonding the semiconductor chip on the corresponding conductive traces comprises:
    heating the semiconductor chip to achieve a temperature at an interface between the Au—Sn alloy bumps and the conductive traces of from about 280 degrees Celsius to about 320 degrees Celsius.

4. The method of claim 1, wherein no annealing operation is conducted after the electroplating and before the bonding.

5. The method of claim 1, wherein the forming patterns of conductive pads on the active surface of the semiconductor chip comprises:
    forming patterns of conductive pads having a height from about 10 μm to about 40 μm on the active surface of the semiconductor chip.

6. The method of claim 2, wherein the immersing the semiconductor chip in the Au—Sn electroplating bath comprises:
    immersing the semiconductor chip in the Au—Sn electroplating bath having a pH value from about 4 to about 6.

7. The method of claim 1, wherein the electroplating the Au—Sn alloy bumps over the conductive pads comprises:
    electroplating the Au—Sn alloy bumps having a height in a range from about 7 μm to about 31 μm over the conductive pads.

8. The method of claim 1, wherein the forming patterns of the conductive pads on the active surface of the semiconductor chip comprises:
    forming patterns of conductive pads on an UBM layer on the active surface of the semiconductor chip.

9. The method of claim 8, further comprising:
    removing the UBM layer not covered by the electroplated Au—Sn alloy bumps.

* * * * *